United States Patent
Liu et al.

(10) Patent No.: US 7,605,667 B2
(45) Date of Patent: Oct. 20, 2009

(54) FREQUENCY SYNTHESIZER WITH A HARMONIC LOCKED PHASE/FREQUENCY DETECTOR

(75) Inventors: Shen-Iuan Liu, Taipei (TW); Chih-Hung Lee, Chiayi Hsien (TW)

(73) Assignees: Mediatek Inc., Hsin-Chu (TW); National Taiwan University, Taipei (TW)

(*) Notice: Subject to any disclaimer, the term of this patent is extended or adjusted under 35 U.S.C. 154(b) by 19 days.

(21) Appl. No.: 11/952,423

(22) Filed: Dec. 7, 2007

(65) Prior Publication Data

US 2008/0266002 A1    Oct. 30, 2008

Related U.S. Application Data

(60) Provisional application No. 60/914,050, filed on Apr. 26, 2007.

(51) Int. Cl.
  *H03B 5/12* (2006.01)
  *H03B 5/18* (2006.01)
  *H03D 13/00* (2006.01)
  *H03L 7/085* (2006.01)
  *H03L 7/087* (2006.01)
  *H03L 7/099* (2006.01)
  *H03L 7/18* (2006.01)

(52) U.S. Cl. .............. 331/25; 331/1 A; 331/8; 331/11; 331/16; 331/17; 331/36 C; 331/96; 331/117 FE; 331/117 D; 331/177 V; 331/179; 327/12; 327/117; 327/118

(58) Field of Classification Search .......... 331/1 A, 331/8, 10–12, 16–18, 25, 36 C, 96, 99–102, 331/117 R, 117 FE, 117 D, 177 R, 177 V, 331/179; 327/2, 5, 7–10, 12, 113–115, 117–118, 327/156–159
See application file for complete search history.

(56) References Cited

U.S. PATENT DOCUMENTS

| | | | | |
|---|---|---|---|---|
| 3,866,137 A | * | 2/1975 | Steel | 331/18 |
| 5,015,971 A | * | 5/1991 | Taylor et al. | 331/16 |
| 5,053,722 A | * | 10/1991 | Kuo et al. | 331/2 |
| 5,055,800 A | * | 10/1991 | Black et al. | 331/1 A |

OTHER PUBLICATIONS

"A 1.2V 37-38.5GHz 8-Phase Clock Generator in 0.13um CMOS Technology" Lee, et al., 2006 Symposium on VLSI Circuits Digest of Technical Papers.
"A 2.5 to 10GHz Clock Multiplier Unit with 0.22ps RMS Jitter in a 0.18um CMOS Technology" Remco C.H. van de Beek et al., 2003 IEEE International Solid-State Circuits Conference.
"A 44GHz Dual-Modulus Divide-by-4/5 Prescaler in 90nm CMOS Technology" Lee, et al., IEEE 2006 Custom Integrated Circuits Conference.
"A 58-to-60.4GHz Frequency Synthesizer in 90nm CMOS" Lee, et al., 2007 IEEE International Solid-State Circuits Conference.

(Continued)

*Primary Examiner*—David Mis
(74) *Attorney, Agent, or Firm*—Thomas, Kayden, Horstemeyer & Risley

(57) ABSTRACT

A frequency synthesizer. The frequency synthesizer comprises a harmonic locked phase/frequency detector, a low pass filter, a voltage controlled oscillator, and a frequency divider. The harmonic locked phase/frequency detector receives a reference signal and a divided signal. The low pass filter is coupled to the harmonic locked phase/frequency detector. The voltage controlled oscillator is coupled to the low pass filter and provides an output signal. The frequency divider is coupled between the voltage controlled oscillator and the harmonic locked phase/frequency detector. Frequency of the divided signal is a harmonic frequency of the reference signal.

9 Claims, 13 Drawing Sheets

OTHER PUBLICATIONS

"A Fully Integrated BiCMOS PLL for 60 GHz Wireless Applications" Winkler, et al., 2005 IEEE International Solid-State Circuits Conference.

"A Fully Integrated V-Band PLL MMIC Using 0.15-um GaAs pHEMT Technology" Jeong et al., IEEE Journal of Solid-State Circuits, vol. 41, No. 5, May 2006.

"Threshold Voltage Mismatch and Intra-Die Leakage Current in Digital CMOS Circuits" Jose Pineda de Gyvez et al., IEEE Journal of Solid-State Circuits, vol. 39, No. 1, Jan. 2004.

* cited by examiner

FREQUENCY SYNTHESIZER WITH A HARMONIC LOCKED PHASE/FREQUENCY DETECTOR

This application claims the benefit of U.S. Provisional Application No. 60/914,050, filed on Apr. 26, 2007, incorporated herein by reference.

BACKGROUND OF THE INVENTION

1. Field of the Invention

The invention relates to a frequency synthesizer and, in particular, to a frequency synthesizer with a harmonic locked phase/frequency detector.

2. Description of the Related Art

A frequency synthesizer is an electronic system for generating any range of frequencies from a single fixed timebase or oscillator. They are found in many modem devices, including radio receivers, mobile telephones, radio telephones, walkie-talkies, CB radios, satellite receives, GPS systems, etc. Since a millimeter wave band of 57-64 GHz has been announced for general unlicensed use, frequency synthesizers may be used to facilitate the giga-data-rate wireless transmission for short distance indoor communications. For multi-Gb/s wireless transceivers, a very-high-speed frequency synthesizer plays a very important role.

A phase locked loop base frequency synthesizer is a commonly used architecture for designers. A phase locked loop compares the frequencies of two signals and produces an error signal which is proportional to the difference between the input frequencies. The error signal is used to drive a voltage controlled oscillator (VCO) which creates an output frequency. The output frequency is fed through a frequency divider back to the input of the system, producing a negative feedback loop. If the output frequency drifts, the error signal will increase, driving the frequency in the opposite direction so as to reduce the error. Thus the output is locked to the frequency at the other input. This input is called the reference and is derived from a crystal oscillator, which is very stable in frequency.

Meanwhile, it is well-known that the active devices in modern advanced CMOS technology suffer from gate leakage and channel-length modulation due to thinner gate oxide thicknesses and shorter channel lengths, of which causes some negative issues in very high-frequency VCO's design. Firstly, to have a wide tuning range for a VCO, a large varactor is often used. However, the parasitic capacitance limits the oscillation frequency. And, resulting gate leakage current degrades the phase noise. Secondly, since cross-coupled devices with short channel lengths may offer finite output resistance, the equivalent quality factor from the LC tank is decreased. This also degrades the phase noise performance and even causes VCO malfunction.

BRIEF SUMMARY OF THE INVENTION

An embodiment of frequency synthesizer comprises a harmonic locked phase/frequency detector, a low pass filter, a voltage controlled oscillator, and a frequency divider. The harmonic locked phase/frequency detector receives a reference signal and a divided signal. The low pass filter is coupled to the harmonic locked phase/frequency detector. The voltage controlled oscillator is coupled to the low pass filter and provides an output signal. The frequency divider is coupled between the voltage controlled oscillator and the harmonic locked phase/frequency detector. Frequency of the divided signal is a harmonic frequency of the reference signal.

An embodiment of a frequency synthesizer comprises a phase/frequency detector, a low pass filter, a voltage controlled oscillator, and a frequency divider. The harmonic locked phase/frequency detector receives a reference signal and a divided signal. The low pass filter is coupled to the harmonic locked phase/frequency detector. The voltage controlled oscillator is coupled to the low pass filter and provides an output signal. The voltage controlled oscillator comprises a pair of MOS transistors and a distributed LC tank coupled to drains of the MOS transistors. The MOS transistors comprise sources coupled to a ground and gates cross-coupled to drains thereof. The distributed LC tank comprises a pair of distributed inductors coupled between a supply voltage and the drains of the MOS transistors and a pair of distributed capacitors coupled between the distributed inductors and a ground.

An embodiment of a frequency synthesizer comprises a phase/frequency detector, a low pass filter, a voltage controlled oscillator, and a frequency divider. The harmonic locked phase/frequency detector receives a reference signal and a divided signal. The low pass filter is coupled to the harmonic locked phase/frequency detector. The voltage controlled oscillator is coupled to the low pass filter and provides an output signal. The frequency divider comprises a master latch and a slave latch comprising data input terminals each coupled to a corresponding data output terminal of the master latch and data output terminals cross-coupled to corresponding data input terminals of the master latch. Each of the master and slave latches comprises a pair of CMOS inverters, a first pair of NMOS transistors, and a second pair of NMOS transistors. Each of the CMOS inverters comprises a capacitor coupled between gates of pull-up and pull-down transistors therein. Each of the first pair of NMOS transistors comprises a source coupled to a drain of one pull-down transistor, a gate receiving the output signal, and a drain coupled to a supply voltage via a resistor and an inductor connected in series. The second pair of NMOS transistors comprise sources coupled to a drain of the other pull-down transistor, gates cross-coupled to the corresponding drains of the first pair of NMOS transistors, and drains coupled to nodes between the resistors and the inductors.

The invention provides a harmonic-locked PLL based frequency synthesizer. The frequency synthesizer increases equivalent input frequency and dividing ratio. As a result, the frequency synthesizer allows a low frequency reference signal, suppresses reference spur, and reduces a settling time thereof.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
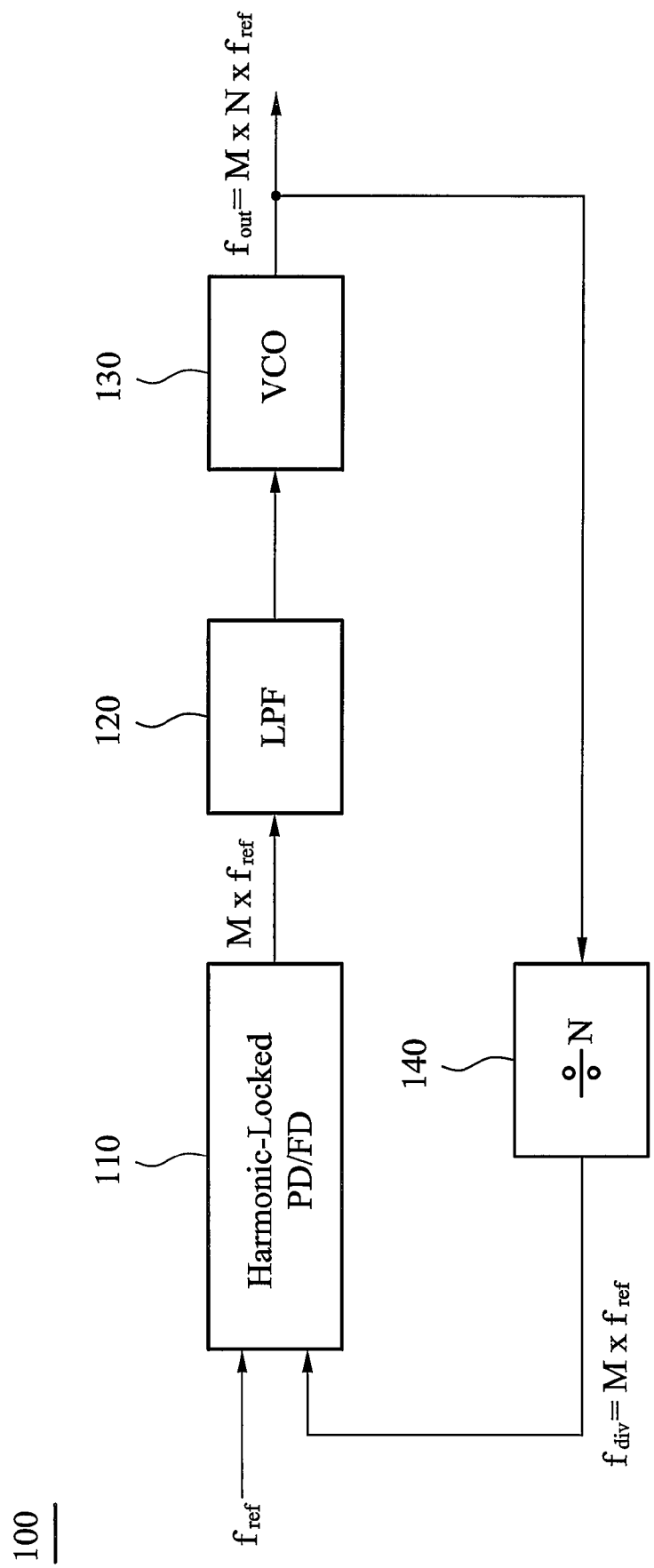
FIG. 1A is a block diagram of a frequency synthesizer according to an embodiment of the invention.

FIG. 1A is a block diagram of a frequency synthesizer according to an embodiment of the invention. The frequency synthesizer 100 comprises a harmonic locked phase/frequency detector 110, a low pass filter 120, a voltage controlled oscillator 130, and a frequency divider 140. The harmonic locked phase/frequency detector 110 receives a reference signal $f_{ref}$ and a divided signal $f_{div}$. The low pass filter 120 is coupled to the harmonic locked phase/frequency detector 110. The voltage controlled oscillator 130 is coupled to the low pass filter 120 and provides an output signal $f_{out}$. The frequency divider 140 is coupled between the voltage controlled oscillator 130 and the harmonic locked phase/frequency detector 110. Frequency of the divided signal $f_{div}$ is a harmonic frequency of the reference signal $f_{ref}$.

Figure 1B:
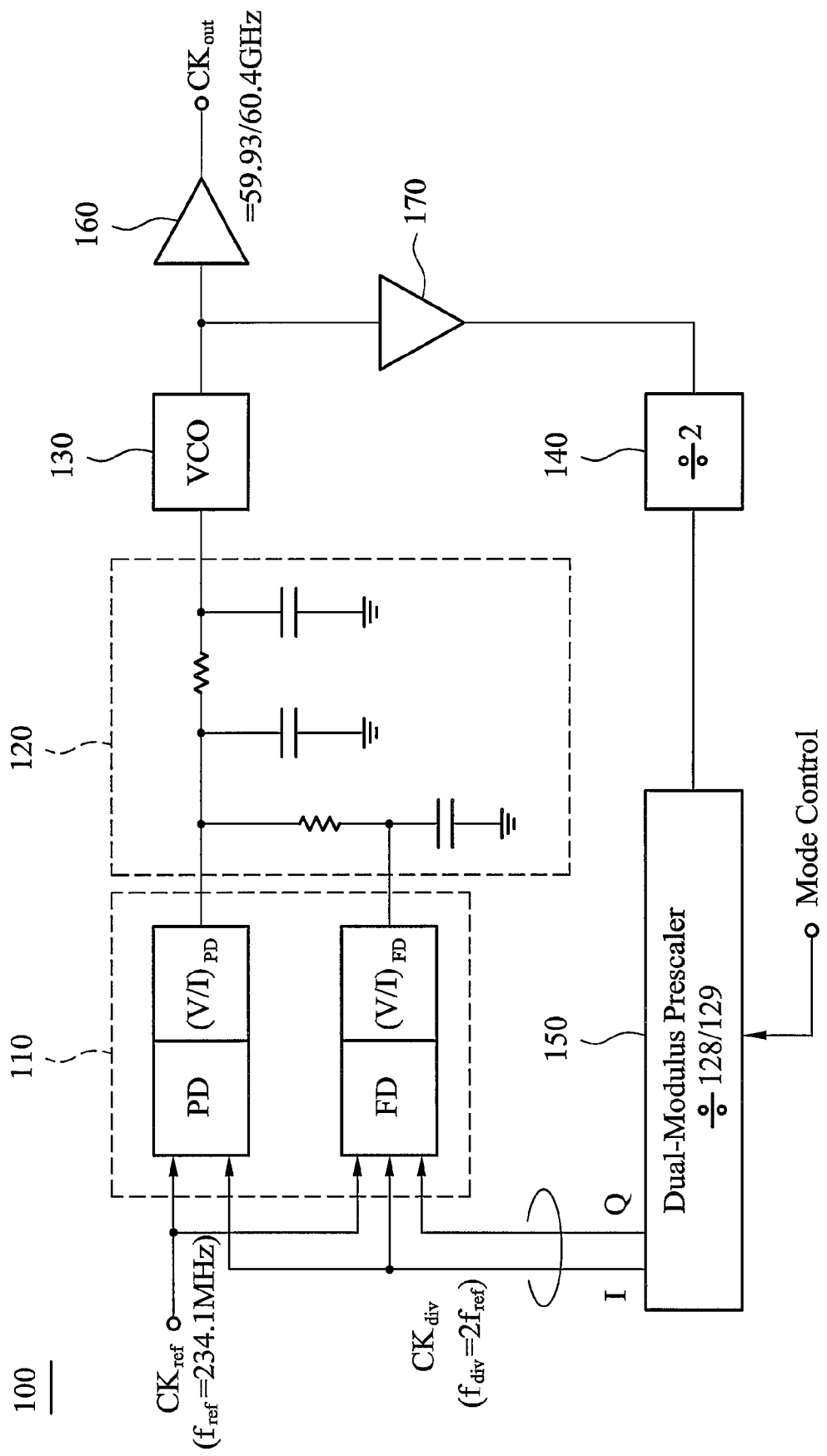
FIG. 1B is a detailed block diagram of the frequency synthesizer in FIG. 1A.

FIG. 1B is a detailed block diagram of the frequency synthesizer in FIG. 1A. Referring to FIG. 1A, $f_{div}$ and $f_{ref}$ respectively denote frequency of $CK_{div}$ and $CK_{ref}$ as shown in FIG. 1B. In the embodiment, frequency of the divided signal $f_{div}$ is twice that of the reference signal $f_{ref}$. Referring to FIG. 1B, a harmonic-locked phase detector (PD) and a harmonic-locked frequency detector (FD) are adopted to reduce spur and reduce settling time. The voltage-controlled oscillator (VCO) 130 is provided with a distributed LC tank and the frequency divider is provided with a current-reuse split-load structure such that high-frequency operation is achieved. Moreover, a dual-modulus divide-by-128/129 prescaler 150 is inserted between the frequency divider 140 and the harmonic-locked phase/frequency detector 110. Preferably, the frequency synthesizer further comprises a buffer 170 coupled between the voltage controlled oscillator 130 and the frequency divider 140 and a buffer coupled between an output of the voltage controlled oscillator and an output of the frequency synthesizer 100.

Figure 2:
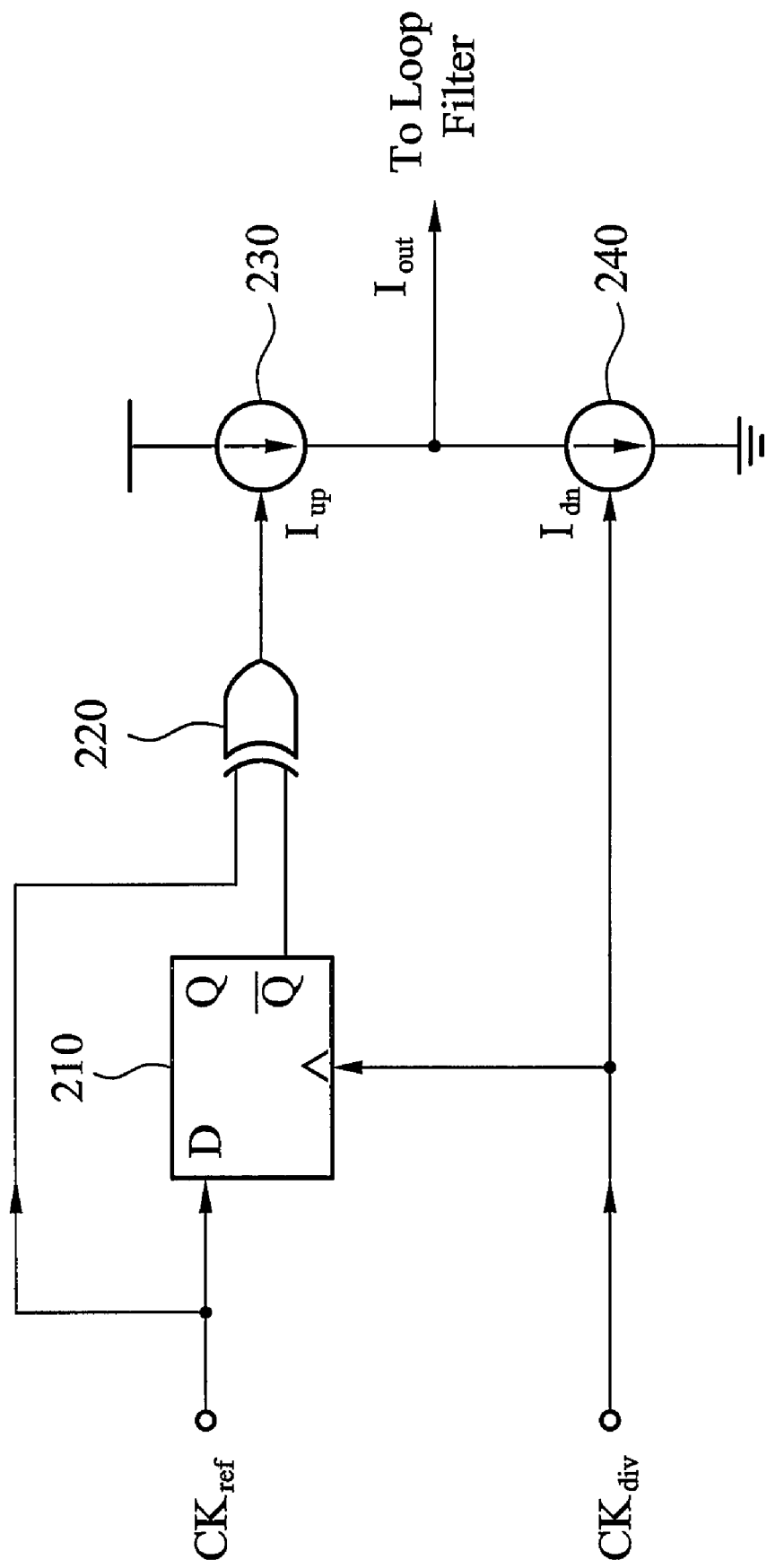
FIG. 2 is a block diagram of an embodiment of the harmonic-locked phase/frequency detector 110 in FIG. 1A.

FIG. 2 is a block diagram of an embodiment of the harmonic-locked phase/frequency detector 110 in FIG. 1A. The harmonic locked phase/frequency detector 110 comprises a D flip-flop 210, a XOR gate 220, a pull-up current source 230, and a pull-down current source 240. The D flip-flop 210 receives the reference signal $f_{ref}$ at a data input terminal D thereof and the divided signal at a clock input terminal thereof. The XOR gate receives the reference signal $f_{ref}$ and an inverting output signal $\overline{Q}$ of the D flip-flop 210. The pull-up current source 230 is controlled by an output signal of the XOR gate 220 and the pull-down current source 240 is controlled by the divided signal $f_{div}$.

Figure 3A:
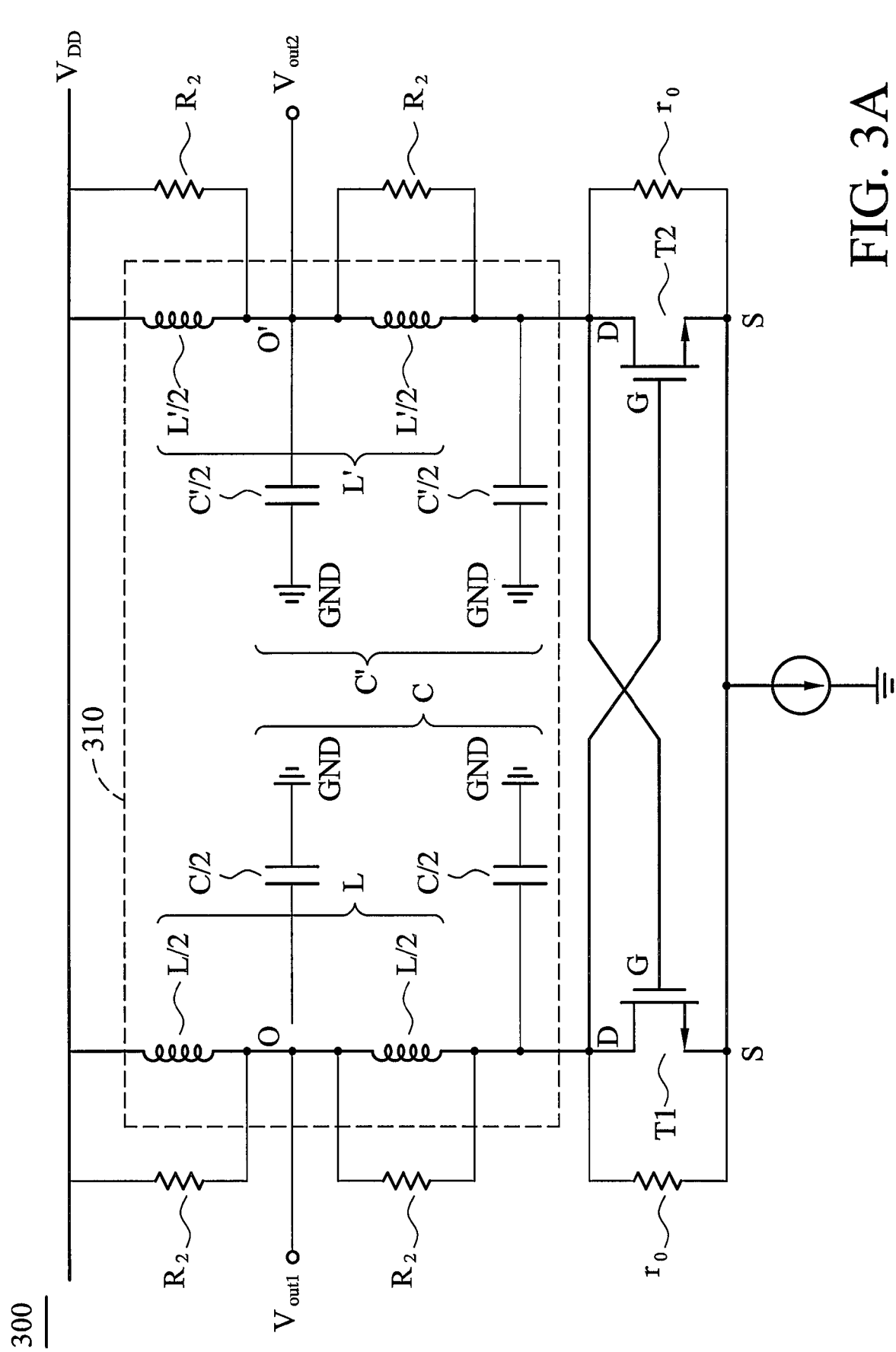
FIGS. 3A and 3B are respectively circuit diagrams of an embodiment of the voltage controlled oscillator in FIG. 1B.
Figure 3B:
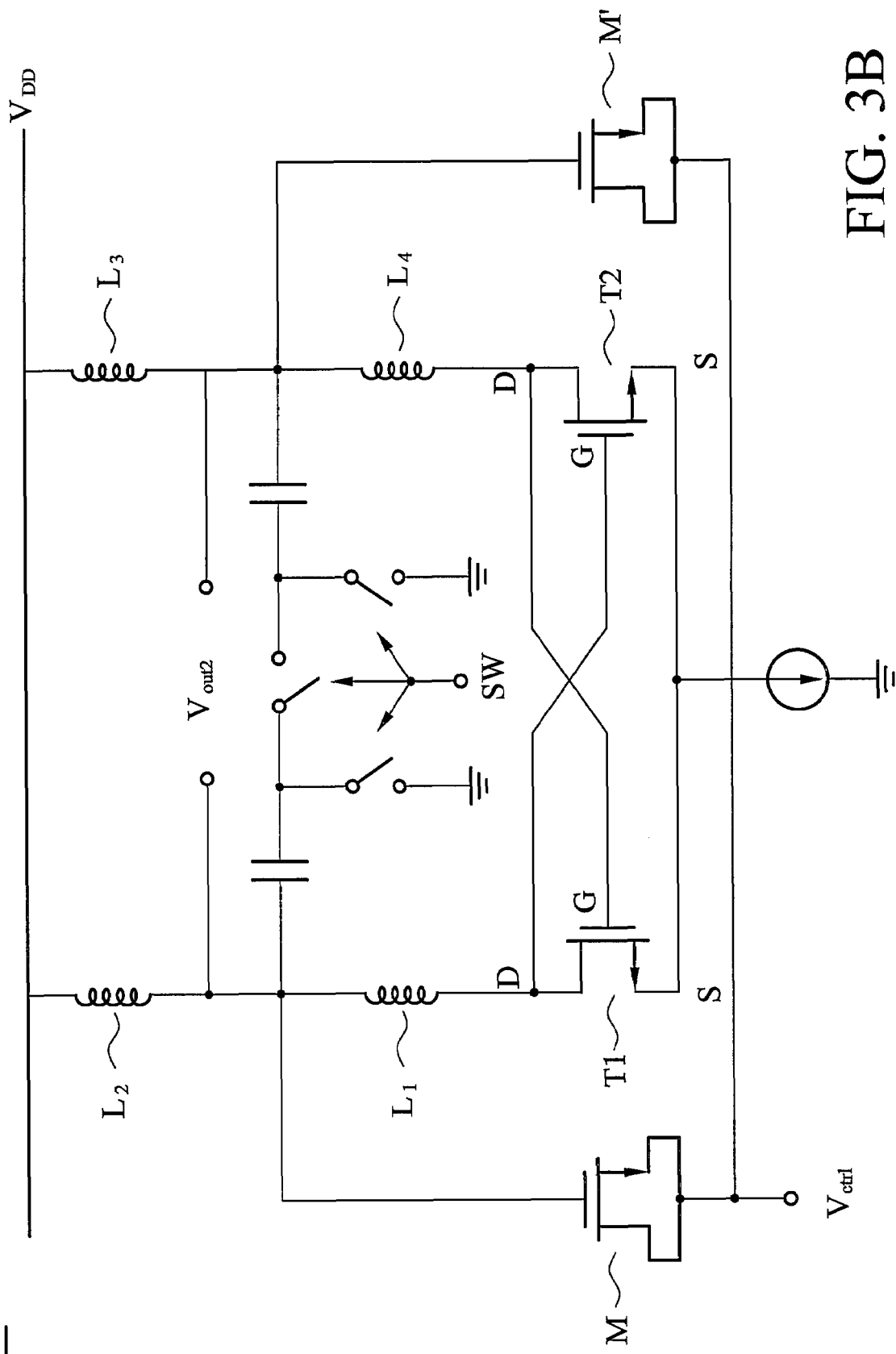
Figure 3C:
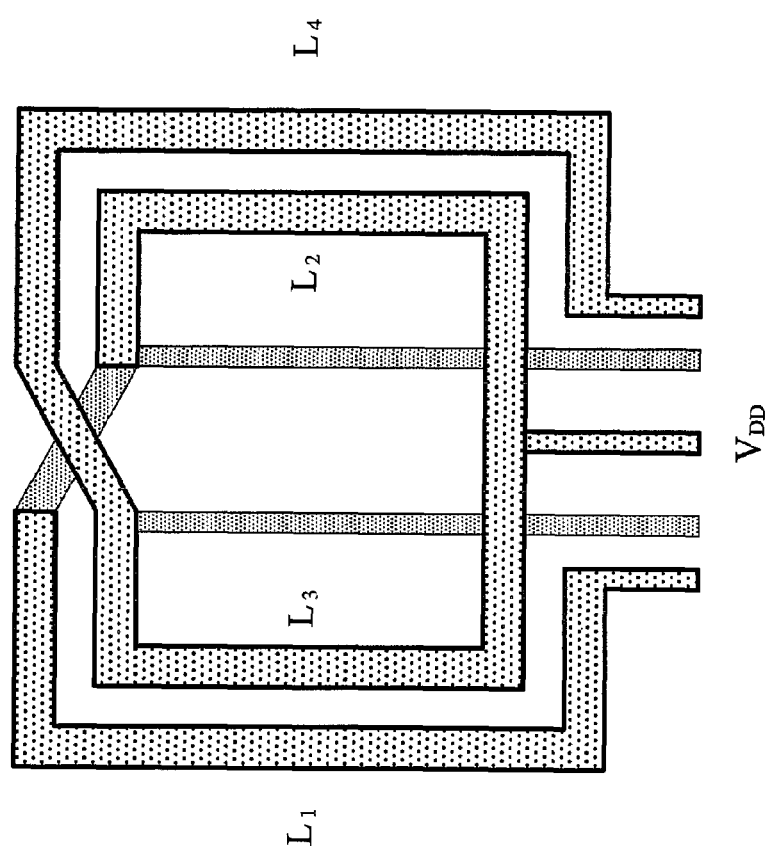
FIG. 3C illustrates layout of four sub-inductors in an embodiment of the voltage controlled oscillator

FIGS. 3A and 3B are respectively circuit diagrams of an embodiment of the voltage controlled oscillator in FIG. 1B. The voltage controlled oscillator 300 comprises a pair of MOS transistors T1/T2 and a distributed LC tank 310 coupled to drains of the MOS transistors T1/T2. The MOS transistors T1/T2 comprise sources S coupled to a ground GND and gates G cross-coupled to drains D thereof. The distributed LC tank 310 comprises a pair of distributed inductors L/L' coupled between a supply voltage $V_{DD}$ and the drains D of the MOS transistors T1/T2 and a pair of distributed capacitors C/C' coupled between the distributed inductors L/L' and a ground GND. More specifically, each of the distributed inductors L/L' is evenly divided as two sub-inductors $$\frac{L}{2}\bigg/\frac{L'}{2}$$

connected in series, and each of the distributed capacitors C/C' is evenly divided as two sub-capacitors $$\frac{C}{2}\bigg/\frac{C'}{2}$$

connected between a corresponding sub-inductor $$\frac{L}{2}\bigg/\frac{L'}{2}$$

and the ground GND. A node O/O' between the sub-inductors $$\frac{L}{2}\bigg/\frac{L'}{2}$$

provides an output signal $V_{out1}/V_{out2}$ of the frequency synthesizer. Referring to FIG. 3B, the inductors $L_1$ and $L_4$ are used to resonate with the parasitic capacitances of the cross-coupled MOS transistor T1/T2. As a result, oscillation frequency is enhanced. The layout for four sub-inductors $L_1$, $L_2$, $L_3$ and $L_4$ is also shown in FIG. 3C. In addition, additional resistors can be coupled across the sub-inductors $$\frac{L}{2}\bigg/\frac{L'}{2},$$

as shown in FIG. 3A. Accordingly, output impedance of the voltage controlled oscillator is increased and phase noise is thus suppressed. To reduce the leakage, a small varactor is adopted instead of a large varactor. To have a wide tuning range, the metal capacitors controlled by three switches SW are used as shown in FIG. 3B. While this VCO drives the divider and the instrument with a 50-□ load, two independent buffers (160 and 170 in FIG. 1B) are used. Moreover, the voltage controlled oscillator further comprises a pair of MOS capacitors M/M' each comprising a gate coupled between a corresponding node between the sub-inductors $$\frac{L}{2}\bigg/\frac{L'}{2}$$

and a source and a drain receiving a control voltage Vctrl such that the voltage controlled oscillator is controlled by the control voltage Vctrl.

Figure 4A:
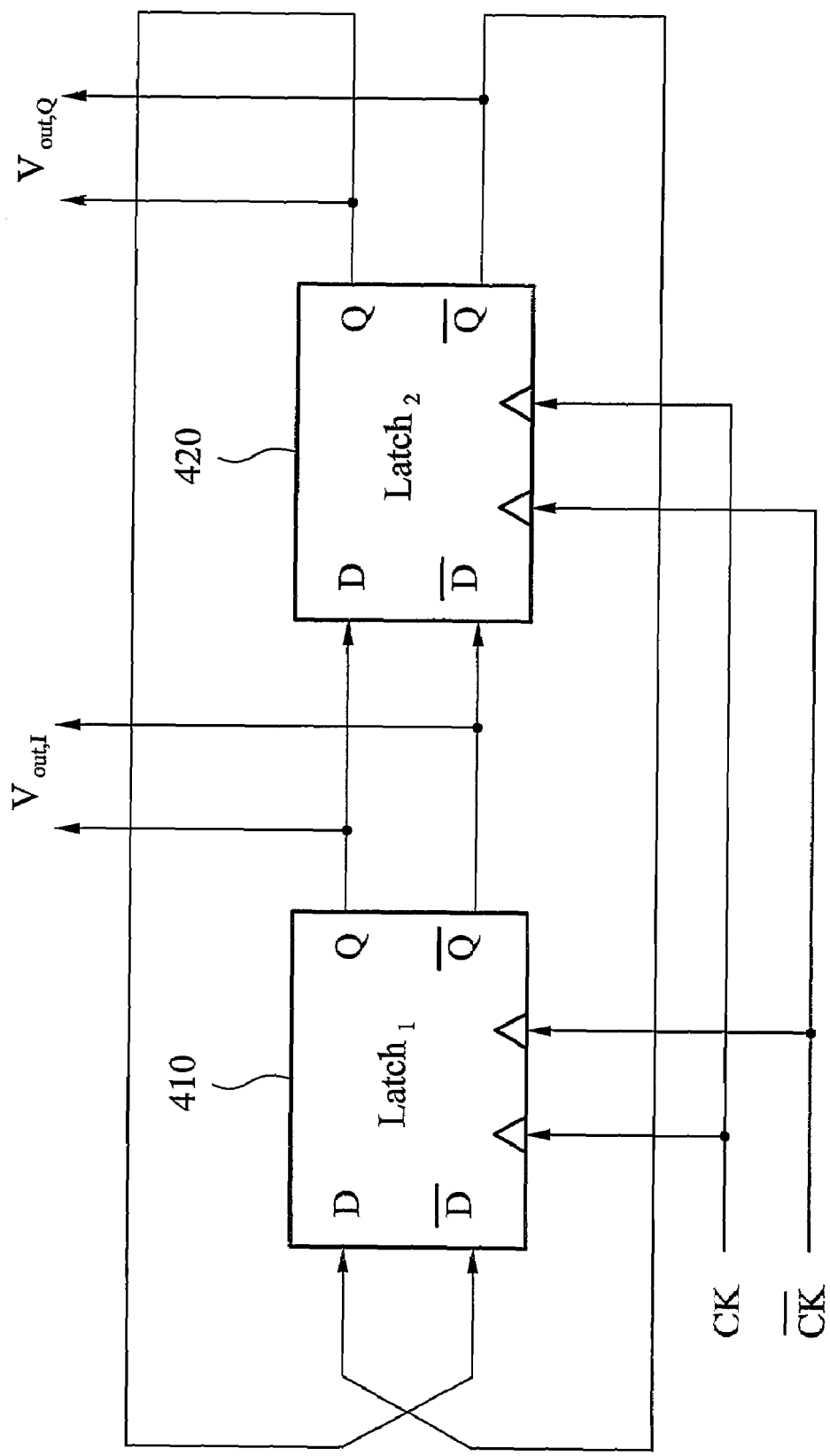
FIG. 4A is a block diagram of an embodiment of the frequency divider in FIG. 1B.

FIG. 4A is a block diagram of an embodiment of the frequency divider in FIG. 1B. The frequency divider comprises a master latch 410 and a slave latch 420. The slave latch 420 comprises data input terminals D/$\overline{D}$ each coupled to a corresponding data output terminal Q/$\overline{Q}$ of the master latch 410 and data output terminals Q/$\overline{Q}$ cross-coupled to corresponding data input terminals D/$\overline{D}$ of the master latch 410. The frequency divider generates output signals $V_{out,I}$ and $V_{out,Q}$ for further processing.

Figure 4B:
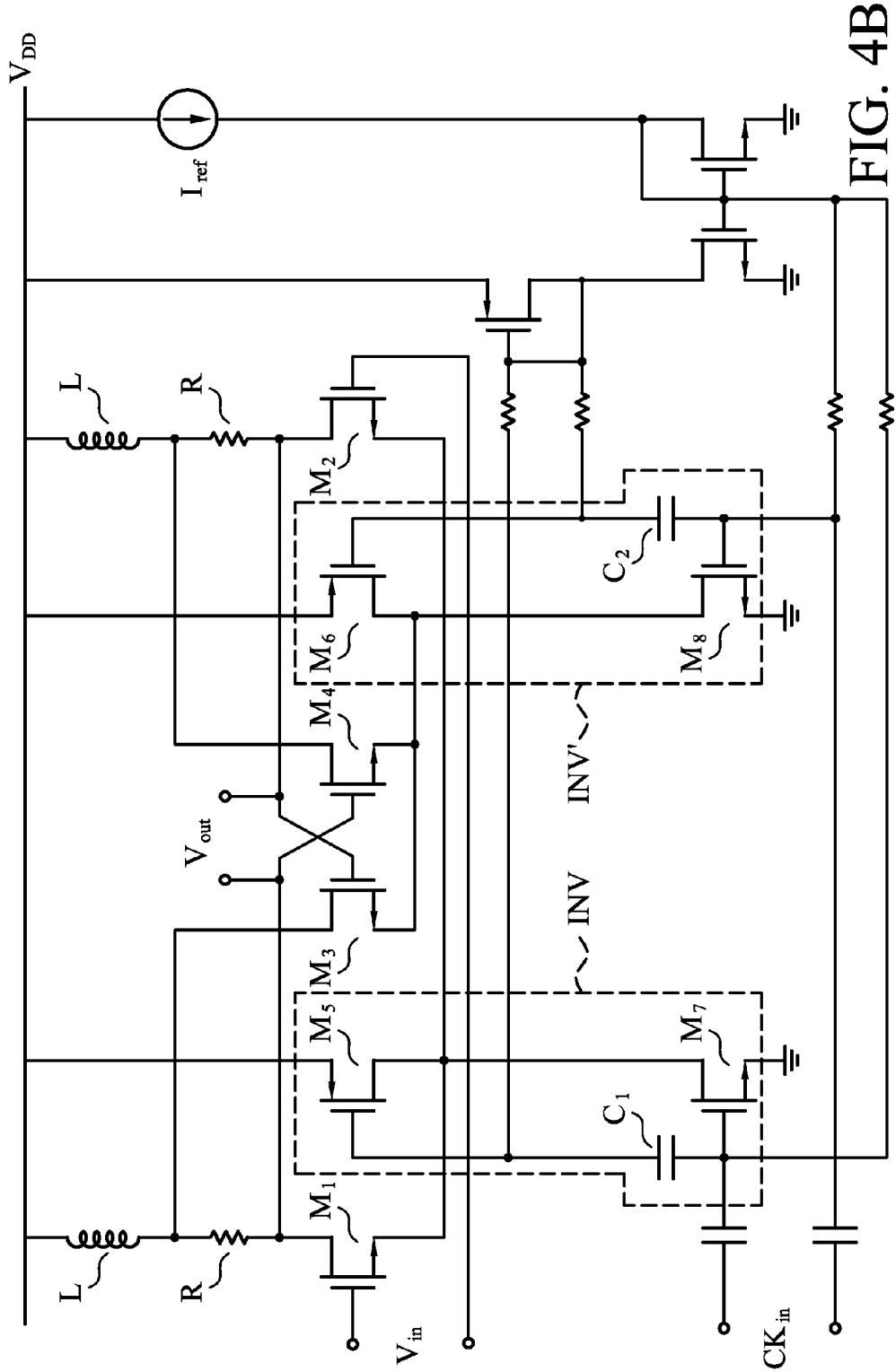
FIG. 4B is a circuit diagram of an embodiment of a current-reuse latch in the frequency divider of FIG. 4A.

To tolerate impact of process and temperature variations on a VCO, the frequency divider with a wide operational range is required. FIG. 4B is a circuit diagram of an embodiment of a current-reuse latch in the frequency divider in FIG. 4A. In a conventional current-mode logic (CML) latch, the input clocking transistor with large widths or large dc bias currents is required to operate at very high frequency. In the embodiment, the transistors $M_5/M_6$ are added to increase total transconductance of the input clocking transistor based on current reuse technique. In addition, it decreases the bias current of the transistors $M_1$, $M_2$, $M_3$, and $M_4$ to enhance switching speed. The split-load technique is also used to enlarge operational frequency range compared with the conventional shunt peaking technique. To realize a static divide-by-2 divider, the master and slave latches are used. Referring to FIG. 4B, each of the master and slave latches 410 and 420 as shown in FIG. 4A comprises a pair of CMOS inverters INV/INV', a first pair of NMOS transistors M1/M2, and a second pair of NMOS transistors M3/M4. Each of the CMOS inverters INV/INV' comprises a capacitor C1/C2 coupled between gates of pull-up transistors M5/M6 and pull-down transistors M7/M8 therein. The transistors M5 and M6 can be PMOS transistors. Each of the first NMOS transistors M1/M2 comprises a source coupled to a drain of one pull-down transistor M7, a gate receiving the output signal from the voltage controlled oscillator, and a drain coupled to a supply voltage $V_{DD}$ via a resistor R and an inductor L connected in series.

Figure 5A:
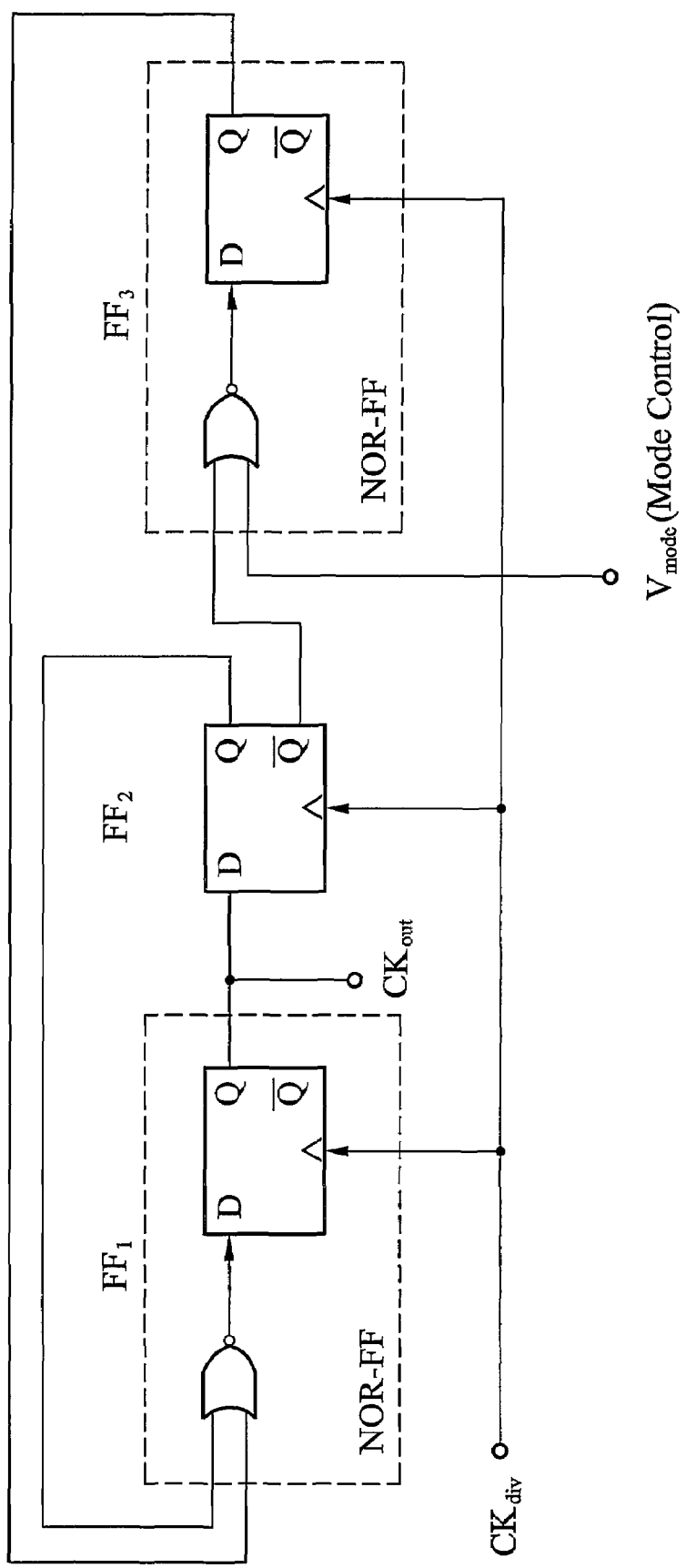
FIGS. 5A and 5B are respectively block diagrams of an embodiment of a synchronous divide-by-4/5 circuit.
Figure 5B:
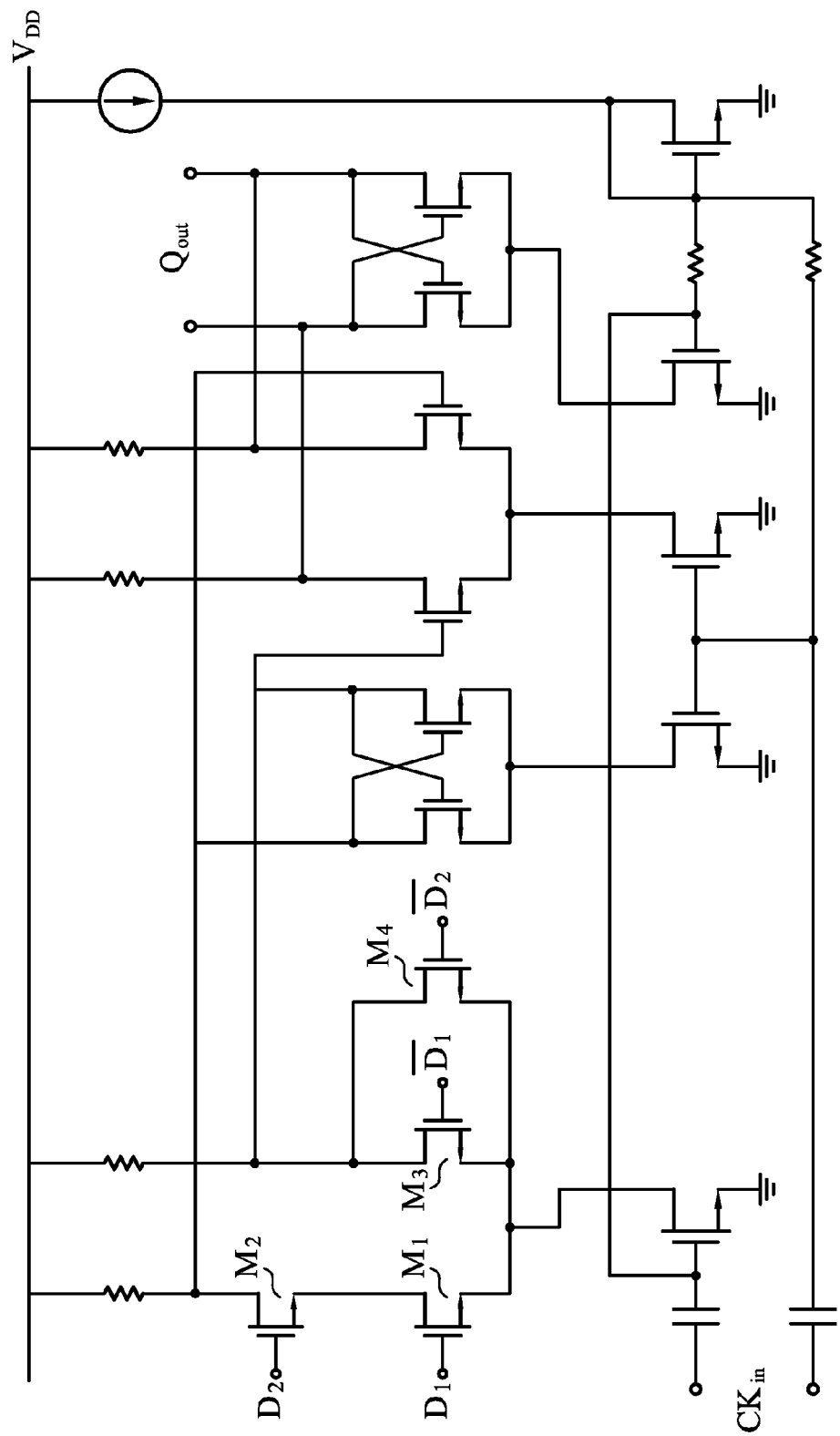

The dual-modulus divide-by-128/129 prescaler 150 as shown in FIG. 1B comprises a synchronous divide-by-4/5 circuit and an asynchronous divide-by-32 circuit realized by cascading five divide-by-2 dividers. FIGS. 5A and 5B are respectively a block diagram of an embodiment of a synchronous divide-by-4/5 circuit. Detailed description thereof is disclosed in "A 44 GHz dual-modulus divide-by-4/5 prescaler in 90 nm CMOS technology," IEEE Custom Integrated Circuits Conference, September 2006, by C. Lee et al. and is incorporated herein as reference. To achieve a high-speed divide-by-4/5 prescaler, a merged NOR-DFF circuit is used to replace the cascade of a NOR gate and a DFF. Gate delay is thus reduced and operating speed is enhanced. It is noted that this prescaler adopts the CML circuits without passive inductors.

Figure 6A:
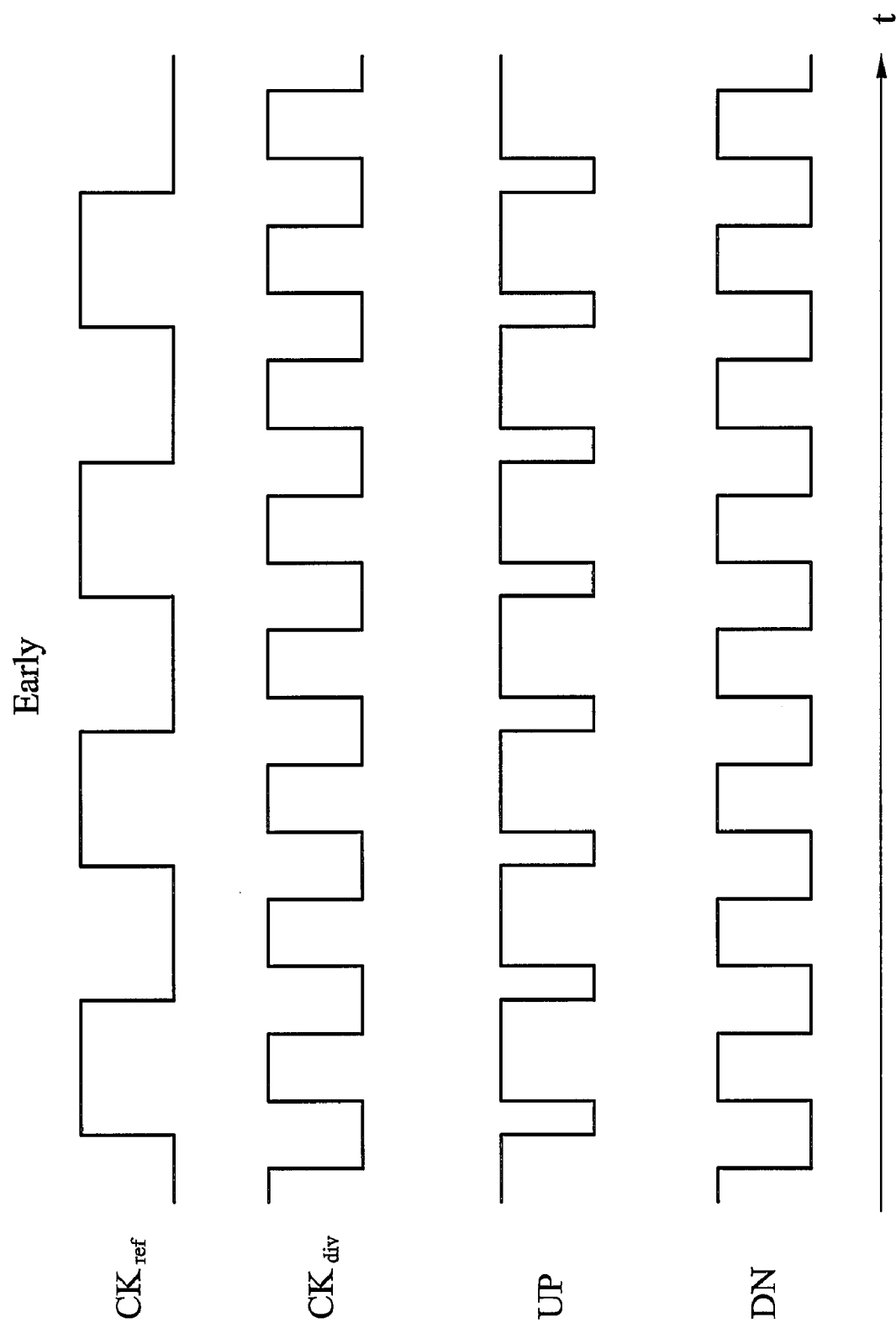
FIGS. 6A to 6C are respectively timing schematic diagrams of early, late and lock conditions of a single-ended harmonic-locked phase detector.
Figure 6B:
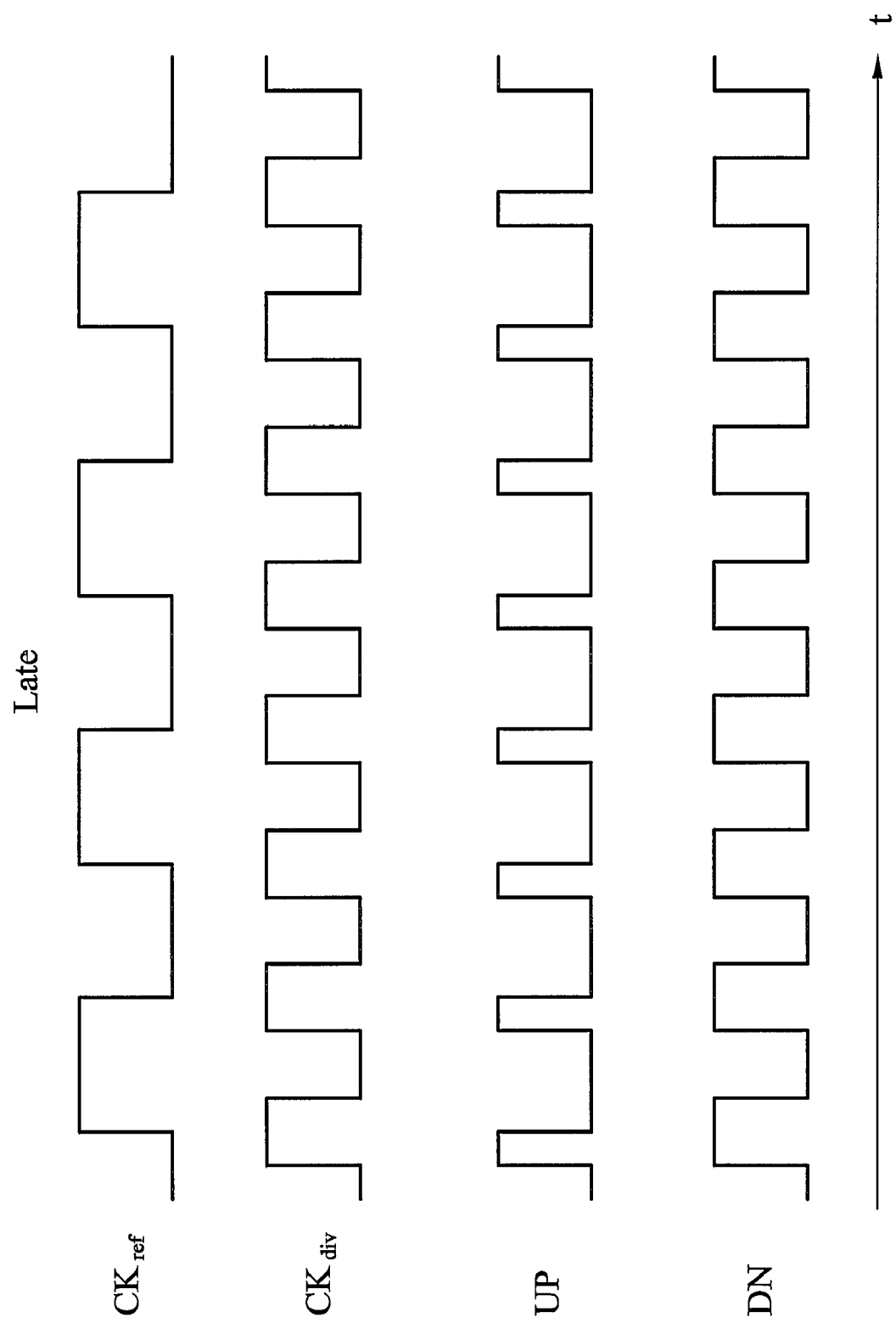
Figure 6C:
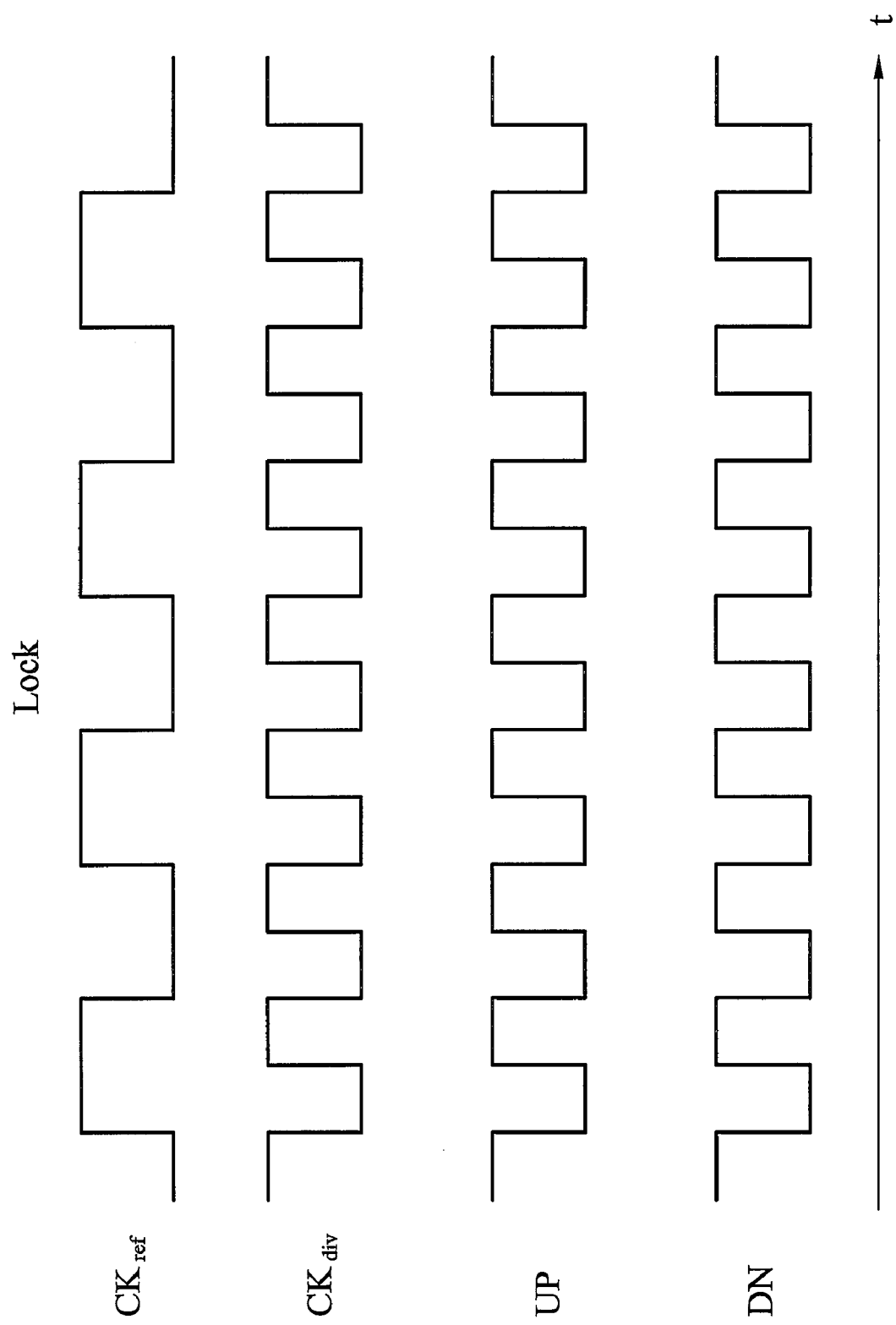

FIGS. 6A to 6C are respectively schematic timing diagrams of a single-ended harmonic-locked phase detector. In the embodiment, the differential CML circuits are actually used to realize the harmonic-locked phase detector as shown in FIG. 1B. As shown in FIG. 1B, the feedback clock $CK_{div}$ comes from the penultimate DFF of the asynchronous divide-by-32 circuit. The feedback clock $CK_{div}$ with twice the frequency of the reference clock $CK_{ref}$ (i.e., $f_{div}=2f_{ref}$) is treated as the down signal "DN". The up signal "UP" is generated by the XOR gate 220 and the DFF 210 as shown in FIG. 2. The timing diagrams for the early, late and lock conditions of the PD are respectively shown in FIGS. 6A, 6B and 6C. For example, FIGS. 6A to 6C show that the equivalent frequency of the up/down signals is twice the reference clock in the lock condition. A conventional frequency detector is used in the embodiment, because it also locks at harmonic frequency. Low reference spur and fast settling time is achieved owing to higher equivalent input frequency by using the harmonic-locked phase/frequency detector. A voltage-to-current converter (V/I) is also used to convert phase/frequency error into a voltage to control the VCO via on-chip loop filter.

The invention provides a harmonic-locked PLL based frequency synthesizer. The frequency synthesizer increases equivalent input frequency and dividing ratio. As a result, the frequency synthesizer allows a low frequency reference signal, suppresses reference spur, and reduces a settling time thereof.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A frequency synthesizer, comprising:
   a harmonic locked phase/frequency detector receiving a reference signal and a divided signal;
   a low pass filter coupled to the harmonic locked phase/frequency detector;
   a voltage controlled oscillator coupled to the low pass filter and providing an output signal; and
   a frequency divider coupled between the voltage controlled oscillator and the harmonic locked phase/frequency detector for dividing the frequency of the output signal so as to generate the divided signal;
   wherein frequency of the divided signal is a harmonic frequency of the reference signal.

2. The frequency synthesizer as claimed in claim 1 wherein the harmonic locked phase/frequency detector comprises a D flip-flop receiving the reference signal at a data input terminal thereof and the divided signal at a clock input terminal thereof, a XOR gate receiving the reference signal and an inverting output signal of the D flip-flop, a pull-up current source, and a pull-down current source, wherein the pull-up current source is controlled by an output signal of the XOR gate and the pull-down current source is controlled by the divided signal.

3. The frequency synthesizer as claimed in claim 1, further comprising a prescaler coupled between the divider and the harmonic locked phase/frequency detector.

4. A frequency synthesizer, comprising:
   a harmonic locked phase/frequency detector receiving a reference signal and a divided signal;
   a low pass filter coupled to the harmonic locked phase/frequency detector;
   a voltage controlled oscillator coupled to the low pass filter and providing an output signal; and
   a frequency divider coupled between the voltage controlled oscillator and the harmonic locked phase/frequency detector for dividing the frequency of the output signal;
   wherein the voltage controlled oscillator comprises:
     a pair of MOS transistors with sources coupled to a ground and gates cross-coupled to drains thereof; and
     a distributed LC tank coupled to the drains of the MOS transistors, the distributed LC tank comprising:
       a pair of distributed inductors coupled between a supply voltage and the drains of the MOS transistors; and
       a pair of distributed capacitors coupled between the distributed inductors and a ground.

5. The frequency synthesizer as claimed in claim 4, wherein each of the distributed inductors is evenly divided as two sub-inductors connected in series, and each of the distributed capacitors is evenly divided as two sub-capacitors, each of the sub-capacitors connected between a respective one of the sub-inductors and the ground, wherein a node between the sub-inductors provides an output signal of the frequency synthesizer.

6. The frequency synthesizer as claimed in claim 5, wherein the voltage controlled oscillator further comprises a plurality of resistors each coupled across a respective one of the sub-inductors.

7. The frequency synthesizer as claimed in claim 5, wherein the voltage controlled oscillator further comprises a pair of MOS capacitors each comprising a gate coupled node between the sub-inductors divided from a respective one of the distributed inductors and a source and a drain receiving a control voltage such that the voltage controlled oscillator is controlled by the control voltage.

8. A frequency synthesizer, comprising:
 a harmonic locked phase/frequency detector receiving a reference signal and a divided signal;
 a low pass filter coupled to the harmonic locked phase/frequency detector;
 a voltage controlled oscillator coupled to the low pass filter and providing an output signal; and
 a frequency divider coupled between the voltage controlled oscillator and the harmonic locked phase/frequency detector for dividing the frequency of the output signal;
 wherein the frequency divider comprises:
  a master latch; and
  a slave latch comprising data input terminals each coupled to a corresponding data output terminal of the master latch and data output terminals cross-coupled to corresponding data input terminals of the master latch;
 wherein each of the master and slave latches comprises:
  a pair of CMOS inverters each comprising a capacitor coupled between gates of pull-up and pull-down transistors therein;
  a first pair of NMOS transistors each comprising a source coupled to a drain of one pull-down transistor, a gate receiving the output signal, and a drain coupled to a supply voltage via a resistor and an inductor connected in series;
  a second pair of NMOS transistors comprising sources coupled to a drain of the other pull-down transistor, gates cross-coupled to the corresponding drains of the first pair of NMOS transistors, and drains coupled to nodes between the resistors and the inductors.

9. The frequency synthesizer as claimed in claim 8, wherein the pull-up transistors of the CMOS inverters are PMOS transistors.

* * * * *